(12) United States Patent
Fujino

(10) Patent No.: US 11,081,355 B2
(45) Date of Patent: Aug. 3, 2021

(54) SEMICONDUCTOR DEVICE AND METHOD OF MANUFACTURING SAME

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Yuhki Fujino, Kanazawa (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/780,986

(22) Filed: Feb. 4, 2020

(65) Prior Publication Data

US 2021/0043458 A1 Feb. 11, 2021

(30) Foreign Application Priority Data

Aug. 7, 2019 (JP) .............................. JP2019-145332

(51) Int. Cl.
*H01L 21/22* (2006.01)
*H01L 21/285* (2006.01)
(Continued)

(52) U.S. Cl.
CPC ............ *H01L 21/22* (2013.01); *H01L 21/265* (2013.01); *H01L 21/28556* (2013.01);
(Continued)

(58) Field of Classification Search
None
See application file for complete search history.

(56) References Cited

U.S. PATENT DOCUMENTS 7,049,650 B1 * 5/2006 Itokawa .................. G11C 11/22
257/295
9,064,711 B2 6/2015 Senoo et al.
(Continued)

FOREIGN PATENT DOCUMENTS

| JP | 7-58322 A | 3/1995 |
| JP | 4813480 B2 | 11/2011 |

(Continued)

*Primary Examiner* — Ali Naraghi
(74) *Attorney, Agent, or Firm* — Oblon, McClelland, Maier & Neustadt, L.L.P.

(57) ABSTRACT

A semiconductor device includes a semiconductor part; first and second electrodes, the semiconductor part being provided between the first and second electrodes; a control electrode selectively provided between the semiconductor part and the second electrode; and a contacting part electrically connecting the semiconductor part and the second electrode. The semiconductor part includes a first layer of a first conductivity type, a second layer of a second conductivity type provided between the first layer and the second electrode, a third layer of the first conductivity type selectively provided between the second layer and the second electrode, and a fourth layer of the second conductivity type selectively provided between the second layer and the second electrode. The contacting part includes a first semiconductor portion of the first conductivity type contacting the third layer, and a second semiconductor portion of the second conductivity type contacting the fourth layer.

7 Claims, 10 Drawing Sheets

(51) Int. Cl.
     *H01L 21/265*     (2006.01)
     *H01L 29/08*     (2006.01)
     *H01L 29/10*     (2006.01)
     *H01L 29/66*     (2006.01)
     *H01L 21/324*     (2006.01)

(52) U.S. Cl.
     CPC ........ *H01L 21/324* (2013.01); *H01L 29/0847* (2013.01); *H01L 29/1095* (2013.01); *H01L 29/6659* (2013.01)

(56) References Cited

U.S. PATENT DOCUMENTS

| | | | | |
|---|---|---|---|---|
| 9,337,282 | B2* | 5/2016 | Kitamura | H01L 29/861 |
| 2006/0237803 | A1* | 10/2006 | Zhu | H01L 29/517 |
| | | | | 257/410 |
| 2009/0026501 | A1* | 1/2009 | Maher | H01L 27/0605 |
| | | | | 257/195 |
| 2009/0035947 | A1 | 2/2009 | Horii et al. | |
| 2012/0032305 | A1* | 2/2012 | Kitamura | H01L 29/36 |
| | | | | 257/607 |

FOREIGN PATENT DOCUMENTS

| | | | |
|---|---|---|---|
| JP | 5083885 | B2 | 11/2012 |
| JP | 5630579 | B2 | 11/2014 |

* cited by examiner

SEMICONDUCTOR DEVICE AND METHOD OF MANUFACTURING SAME

CROSS-REFERENCE TO RELATED APPLICATIONS

This application is based upon and claims the benefit of priority from Japanese Patent Application No. 2019-145332, filed on Aug. 7, 2019; the entire contents of which are incorporated herein by reference.

FIELD

Embodiments relate to a semiconductor device and a method of manufacturing the same.

BACKGROUND

There is a semiconductor device in which the carrier lifetime is shortened by diffusing a heavy metal inside a semiconductor. For example, in a semiconductor device having a MOS structure, the concentration of the heavy metal inside the semiconductor layer easily becomes non-uniform when the heavy metal is diffused from the front surface on the MOS structure side.

DETAILED DESCRIPTION

Figure 1:
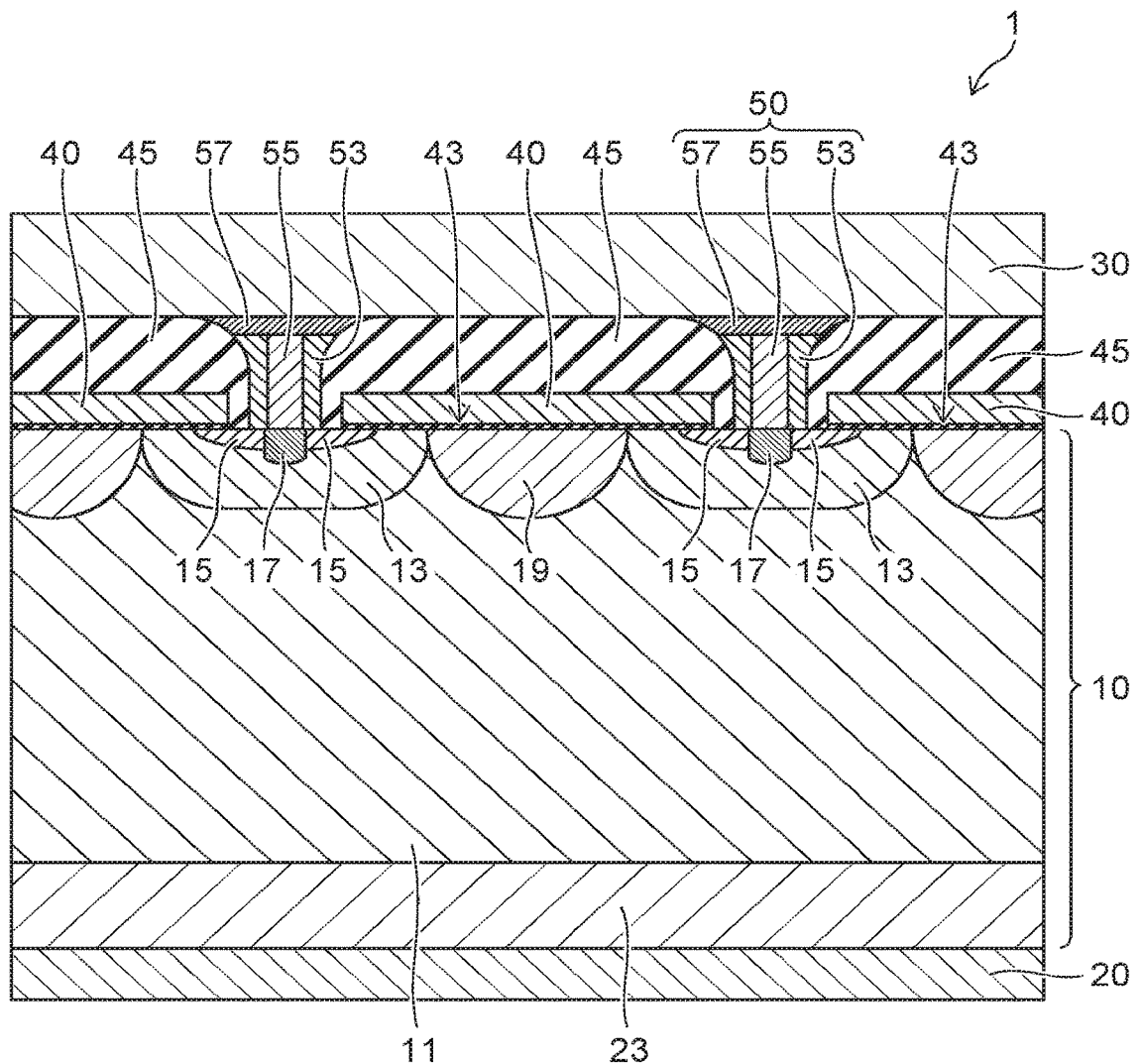
FIG. 1 is a schematic cross-sectional view showing a semiconductor device according to an embodiment.

According to one embodiment, a semiconductor device includes a semiconductor part including a first semiconductor layer of a first conductivity type; a first electrode provided on the semiconductor part; a second electrode, the semiconductor part being provided between the first electrode and the second electrode; a control electrode selectively provided between the semiconductor part and the second electrode, and a contacting part electrically connecting the semiconductor part and the second electrode. The control electrode is electrically isolated from the semiconductor part by a first insulating film, and electrically isolated from the second electrode by a second insulating film. The semiconductor part further includes a second semiconductor layer of a second conductivity type, a third semiconductor layer of the first conductivity type and a fourth semiconductor layer of the second conductivity type. The second semiconductor layer is selectively provided between the first semiconductor layer and the second electrode. The third semiconductor layer is selectively provided between the second semiconductor layer and the second electrode. The fourth semiconductor layer is selectively provided between the second semiconductor layer and the second electrode. The fourth semiconductor layer includes a second conductivity type impurity with a higher concentration than a concentration of a second conductivity type impurity in the second semiconductor layer. The control electrode is provided to face the second semiconductor layer with the first insulating film interposed. The contacting part includes a first semiconductor portion of the first conductivity type and a second semiconductor portion of the second conductivity type. The first semiconductor portion contacts the third semiconductor layer, and is electrically connected to the third semiconductor layer. The second semiconductor portion contacts the fourth semiconductor layer, and is electrically connected to the fourth semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is a power MOSFET and has, for example, a planar gate structure.

The semiconductor device 1 includes a semiconductor part 10, a drain electrode 20 (a first electrode), a source electrode 30 (a second electrode), and a gate electrode 40. The semiconductor part 10 is, for example, silicon. The drain electrode 20 is provided at the backside of the semiconductor part 10. The source electrode 30 is provided at the front surface side of the semiconductor part 10.

The gate electrode 40 is provided between the semiconductor part 10 and the source electrode 30. The gate electrode 40 is electrically insulated from the semiconductor part 10 with a gate insulating film 43 interposed. The gate electrode 40 also is electrically insulated from the source electrode 30 with an inter-layer insulating film 45 interposed.

The semiconductor part 10 includes an n-type drift layer 11 (a first semiconductor layer), a p-type base layer 13 (a second semiconductor layer), an n-type source layer 15 (a third semiconductor layer), and a p-type contact layer 17 (a fourth semiconductor layer).

The n-type drift layer 11 extends between the drain electrode 20 and the source electrode 30. When OFF, the n-type drift layer 11 is depleted by a drain voltage applied between the drain electrode 20 and the source electrode 30, and has a thickness that realizes a prescribed breakdown voltage.

The p-type base layer 13 is positioned between the n-type drift layer 11 and the source electrode 30. The p-type base layer 13 includes a p-type impurity with a higher concentration than the concentration of the n-type impurity in the n-type drift layer 11. A portion of the p-type base layer 13 is provided at a position facing the gate electrode 40 via the gate insulating film 43.

The n-type source layer 15 is selectively provided between the p-type base layer 13 and the source electrode 30. The n-type source layer 15 includes an n-type impurity with a higher concentration than the concentration of the n-type impurity in the n-type drift layer 11. A portion of the n-type source layer 15 is provided at a position facing the gate electrode 40 via the gate insulating film 43.

The p-type contact layer 17 is selectively provided between the p-type base layer 13 and the source electrode 30. The p-type contact layer 17 includes a p-type impurity with a higher concentration than the concentration of the p-type impurity in the p-type base layer 13. For example, the p-type contact layer 17 is arranged with the n-type source layer 15 in a direction along the front surface of the semiconductor part 10.

The source electrode 30 is electrically connected to the n-type source layer 15 and the p-type contact layer 17 at a portion where the gate electrode 40 is not provided. The p-type base layer 13 is electrically connected to the source electrode 30 via the p-type contact layer 17.

In the example, a contacting part 50 is provided and electrically connects between the n-type source layer 15 and the source electrode 30 and between the p-type contact layer 17 and the source electrode 30. The contacting part 50 includes an n-type semiconductor portion 53, a p-type semiconductor portion 55, and a silicide region 57.

The contacting part 50 pierces the inter-layer insulating film 45 and extends in the direction from the source electrode 30 toward the semiconductor part 10. The n-type semiconductor portion 53 and the p-type semiconductor portion 55 are positioned between the semiconductor part 10 and the silicide region 57. The source electrode 30 contacts the silicide region 57 and is electrically connected to the silicide region 57.

The n-type semiconductor portion 53 is positioned between the inter-layer insulating film 45 and the p-type semiconductor portion 55. The n-type semiconductor portion 53 contacts the n-type source layer 15 and is electrically connected to the n-type source layer 15. The n-type semiconductor portion 53 also contacts the silicide region 57 and is electrically connected to the silicide region 57.

The p-type semiconductor portion 55 contacts the p-type contact layer 17 and is electrically connected to the p-type contact layer 17. The p-type semiconductor portion 55 also contacts the silicide region 57 and is electrically connected to the silicide region 57.

The semiconductor part 10 further includes an n-type semiconductor layer 19 and an n-type drain layer 23. The n-type semiconductor layer 19 and the n-type drain layer 23 include n-type impurities with higher concentrations than the concentration of the n-type impurity in the n-type drift layer 11. The n-type impurity concentration in the n-type semiconductor layer 19 is lower than the n-type impurity concentration in the n-type source layer 15.

The n-type semiconductor layer 19 is selectively provided between the n-type drift layer 11 and the gate electrode 40. The n-type semiconductor layer 19 contacts the gate insulating film 43 and faces the gate electrode 40 via the gate insulating film 43. For example, the n-type semiconductor layer 19 is provided between the p-type base layers 13 next to each other in a direction (e.g., the X-direction) along the front surface of the semiconductor part 10. The p-type base layer 13 is provided so that a portion of the p-type base layer 13 faces the gate electrode 40 via the gate insulating film 43 between the n-type source layer 15 and the n-type semiconductor layer 19.

The n-type drain layer 23 is positioned between the n-type drift layer 11 and the drain electrode 20. For example, the drain electrode 20 contacts the n-type drain layer 23 and is electrically connected to the n-type drain layer 23.

In the semiconductor device 1 according to the embodiment, the silicide region 57 includes, for example, platinum (Pt). In other words, the silicide region 57 includes platinum silicide. The n-type semiconductor portion 53 and the p-type semiconductor portion 55 also include platinum (Pt). The semiconductor part 10 also includes the platinum (Pt) diffused from the silicide region 57 via the n-type semiconductor portion 53 and the p-type semiconductor portion 55. Thereby, the lifetime of the carriers in the semiconductor part 10 can be shortened; and the switching speed of the semiconductor device 1 can be faster.

The metallic element that is included in the silicide region 57 and the semiconductor part 10 is not limited to platinum (Pt) and may be, for example, at least one element of platinum (Pt), ruthenium (Rh), palladium (Pd), osmium (Os), iridium (Ir), or gold (Au).

A method of manufacturing the semiconductor device 1 according to the embodiment will now be described with reference to FIG. 2A to FIG. 5B. FIG. 2A to FIG. 5B are schematic cross-sectional views showing a manufacturing process of the semiconductor device 1 in order.

Figure 2A:
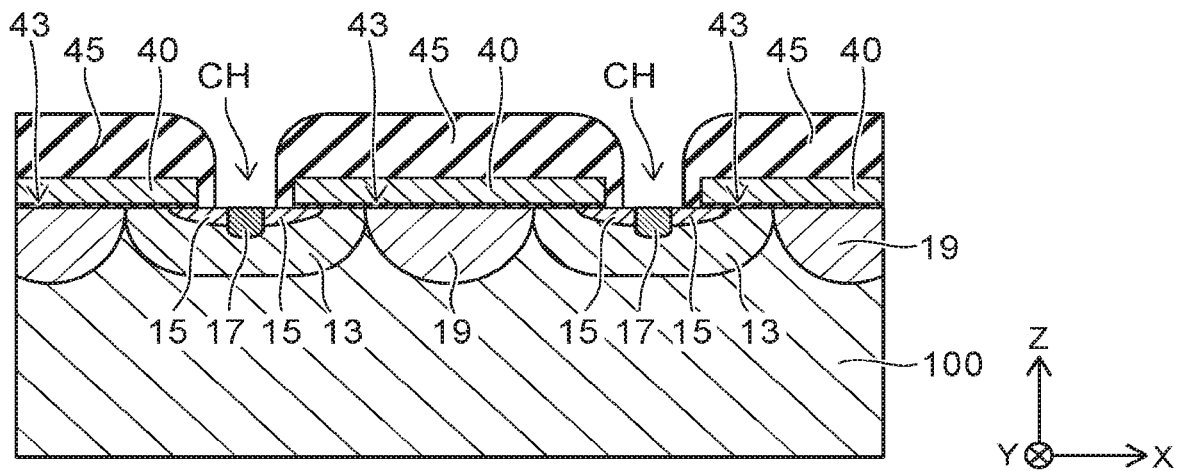
FIG. 2A to FIG. 5B are schematic cross-sectional views showing a manufacturing process of the semiconductor device.

As shown in FIG. 2A, the p-type base layer 13, the n-type source layer 15, the p-type contact layer 17, the n-type semiconductor layer 19, the gate electrode 40, the gate insulating film 43, and the inter-layer insulating film 45 are formed at the front surface side of a semiconductor wafer 100; subsequently, a contact hole CH is formed in the inter-layer insulating film 45. The contact hole CH is formed to communicate with the n-type source layer 15 and the p-type contact layer 17. The semiconductor wafer 100 is, for example, an n-type silicon wafer and includes an n-type impurity with the same concentration as the n-type impurity concentration in the n-type drift layer 11.

Figure 2B:
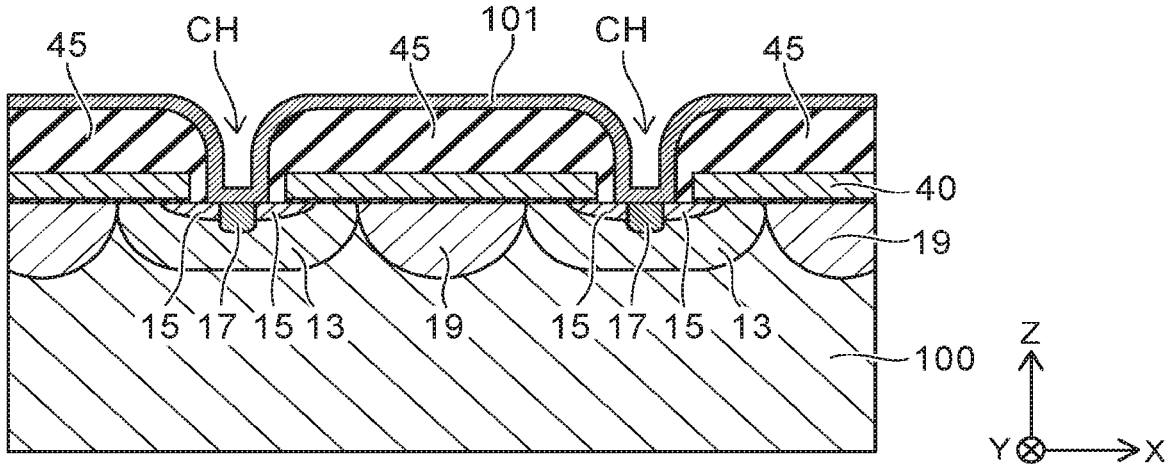

As shown in FIG. 2B, an n-type semiconductor film 101 is formed at the front surface side of the semiconductor wafer 100. The n-type semiconductor film 101 is, for example, a polysilicon film formed using CVD (Chemical Vapor Deposition). The n-type semiconductor film 101 is formed to cover the upper surface of the inter-layer insulating film 45 and the inner surfaces of the contact hole CH so that space remains inside the contact hole CH. The n-type semiconductor film 101 includes, for example, an n-type impurity added when depositing. An n-type impurity, e.g., phosphorus (P) may be doped by vapor phase diffusion after depositing the n-type semiconductor film 101.

Figure 2C:
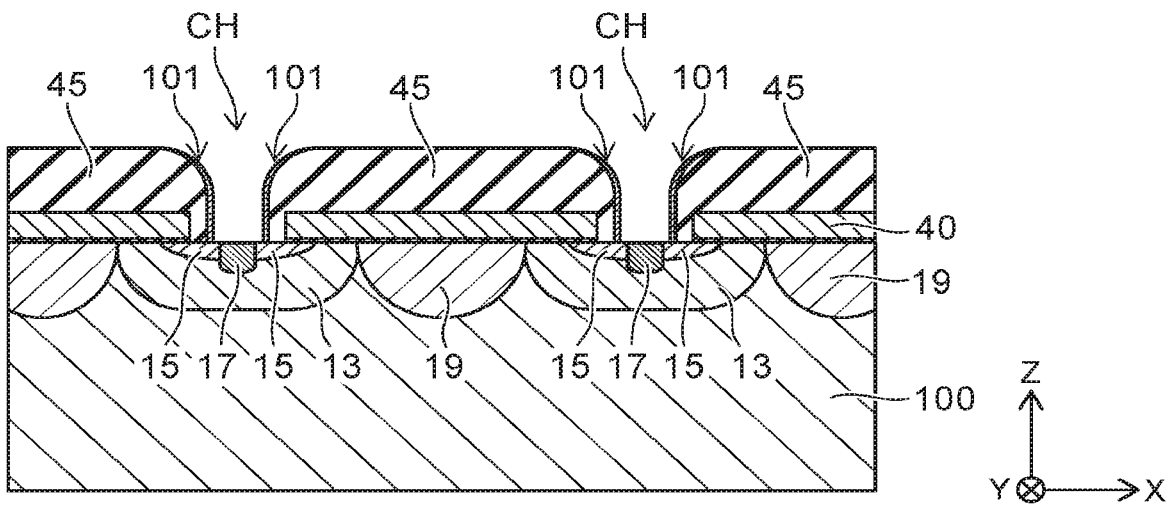

As shown in FIG. 2C, the n-type semiconductor film 101 is selectively removed so that a portion deposited on the inner wall of the contact hole CH remains. The n-type semiconductor film 101 is selectively removed by, for example, anisotropic etching using RIE (Reactive Ion Etching).

Figure 3A:
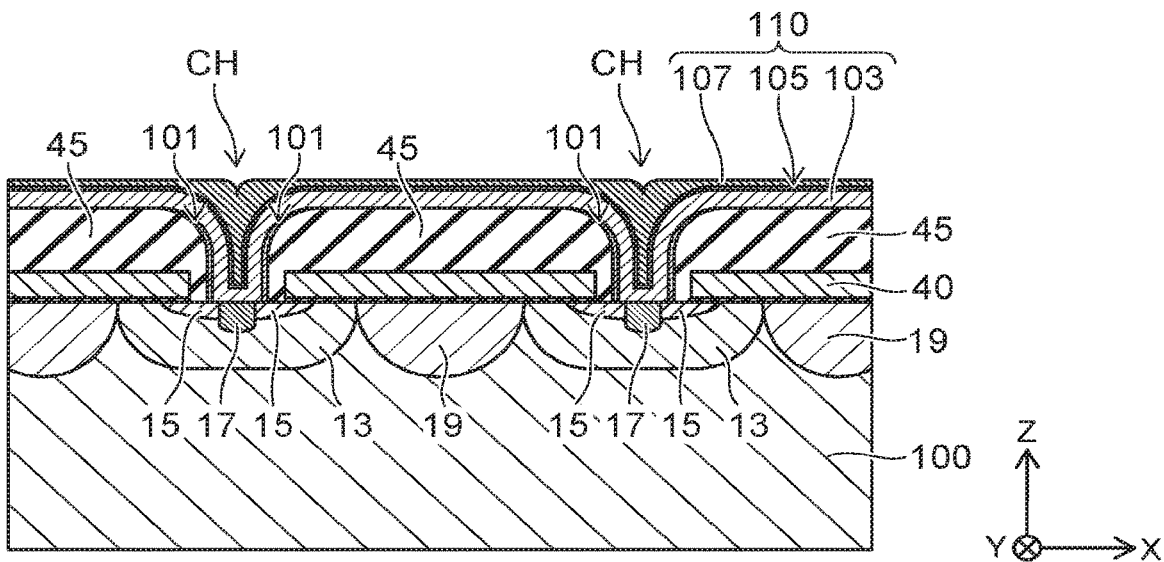

As shown in FIG. 3A, a semiconductor film 103, a p-type impurity region 105, and a semiconductor film 107 are formed in order at the front surface side of the semiconductor wafer 100.

The semiconductor film 103 is, for example, a polysilicon film formed using CVD. The semiconductor film 103 is formed without intentionally doping an impurity. The semiconductor film 103 is formed to cover the upper surface of the inter-layer insulating film 45 and the inner surface of the contact hole CH so that a space remains inside the contact hole CH. The n-type semiconductor film 101 that remains on the inner wall of the contact hole CH is positioned between the inter-layer insulating film 45 and the semiconductor film 103.

Continuing, the p-type impurity region 105 is formed by ion-implanting a p-type impurity, e.g., boron (B). The p-type impurity region 105 is formed on the entire front surface of the semiconductor film 103.

The semiconductor film 107 is formed to cover the p-type impurity region 105. The semiconductor film 107 is, for example, a polysilicon film formed using CVD and is formed without intentionally doping an impurity. The semiconductor film 107 is formed to fill the space inside the contact hole CH.

Figure 3B:
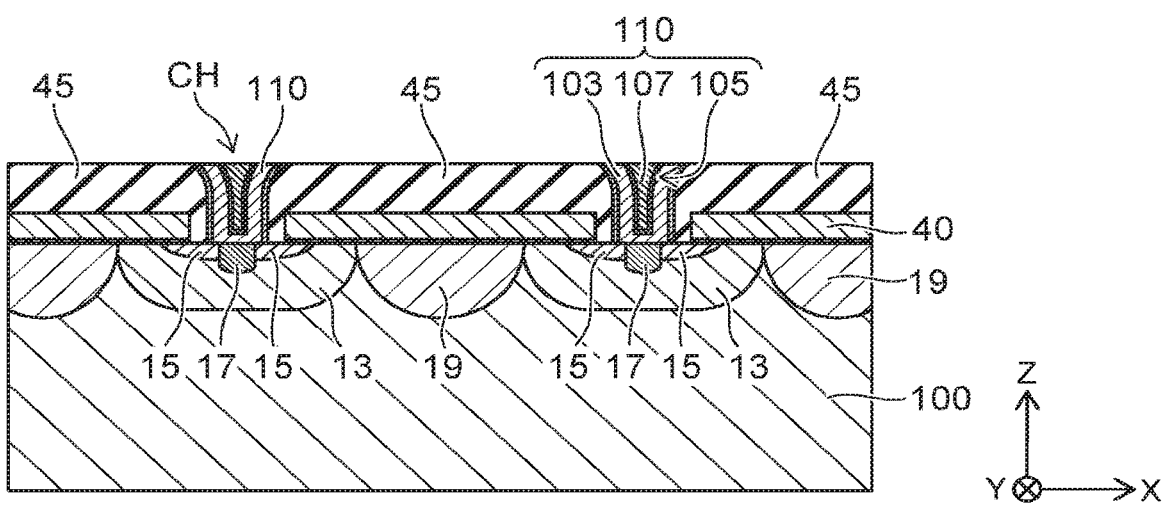

As shown in FIG. 3B, the semiconductor film 103, the p-type impurity region 105, and the semiconductor film 107 that are formed on the inter-layer insulating film 45 are selectively removed so that the portions filling the contact hole CH remain. The semiconductor film 103, the p-type impurity region 105, and the semiconductor film 107 are removed using, for example, CMP (Chemical Mechanical Polishing). The upper surface of the inter-layer insulating film 45 and the upper surfaces of the portions remaining inside the contact hole CH are planarized thereby.

Figure 3C:
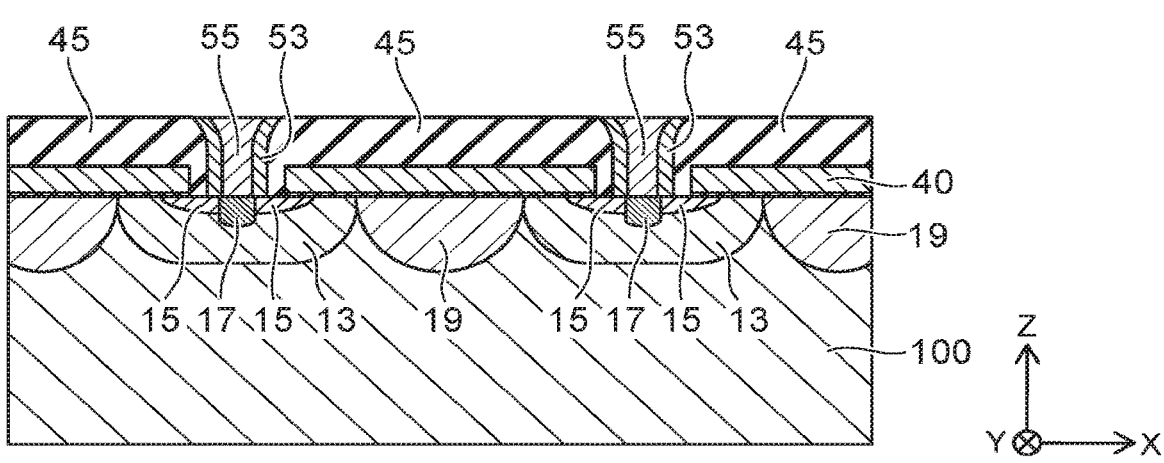

As shown in FIG. 3C, the n-type impurity of the n-type semiconductor film 101 and the p-type impurity of the p-type impurity region 105 are diffused by heat treatment to form the n-type semiconductor portion 53 and the p-type semiconductor portion 55. The n-type semiconductor portion 53 is formed to contact the n-type source layer 15. The p-type semiconductor portion 55 is formed to contact the p-type contact layer 17.

Figure 4A:
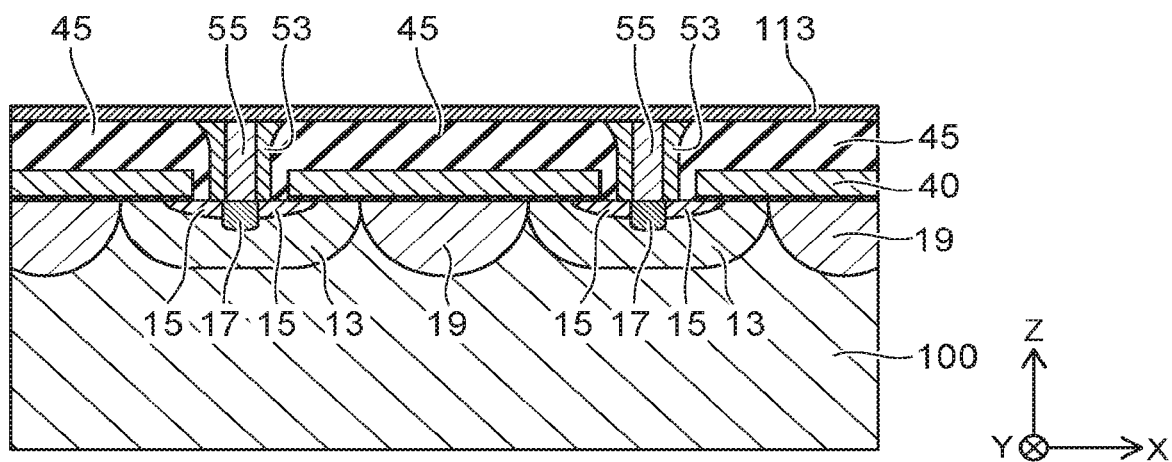

As shown in FIG. 4A, a metal film 113 is formed at the front surface side of the semiconductor wafer 100. For example, the metal film 113 is formed using sputtering and includes platinum (Pt). The metal film 113 is formed to cover the inter-layer insulating film 45, the n-type semiconductor portion 53, and the p-type semiconductor portion 55.

Figure 4B:
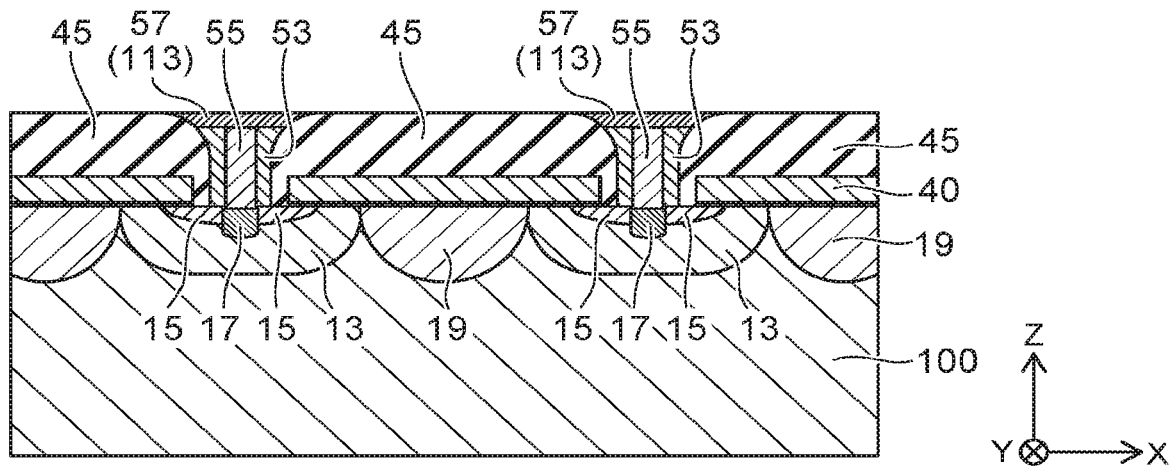

As shown in FIG. 4B, the silicide region 57 that covers the n-type semiconductor portion 53 and the p-type semiconductor portion 55 is formed. For example, the silicide region 57 is formed by performing heat treatment to silicide the interface of the metal film 113 and the n-type semiconductor portion 53 and the interface of the metal film 113 and the p-type semiconductor portion 55 and by subsequently selectively removing the unreacted portion of the metal film 113.

Figure 4C:
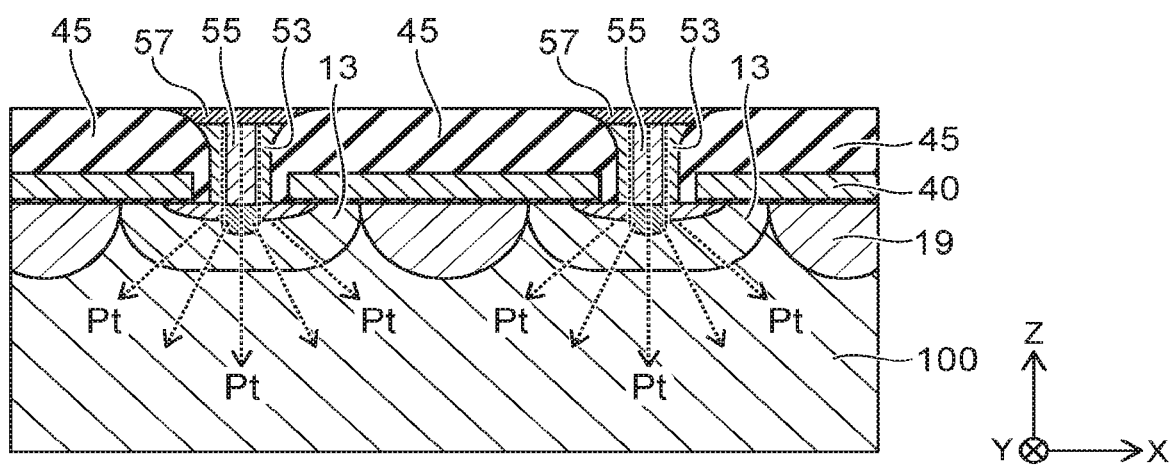

As shown in FIG. 4C, the platinum (Pt) that is included in the silicide region 57 is thermally diffused toward the semiconductor wafer 100. Because the diffusion coefficient of platinum (Pt) inside silicon is large, the platinum (Pt) is diffused inside the semiconductor wafer 100 via the n-type semiconductor portion 53 and the p-type semiconductor portion 55 by the heat treatment. Thereby, the platinum (Pt) of the silicide region 57 can be diffused uniformly toward the semiconductor wafer 100.

Figure 5A:
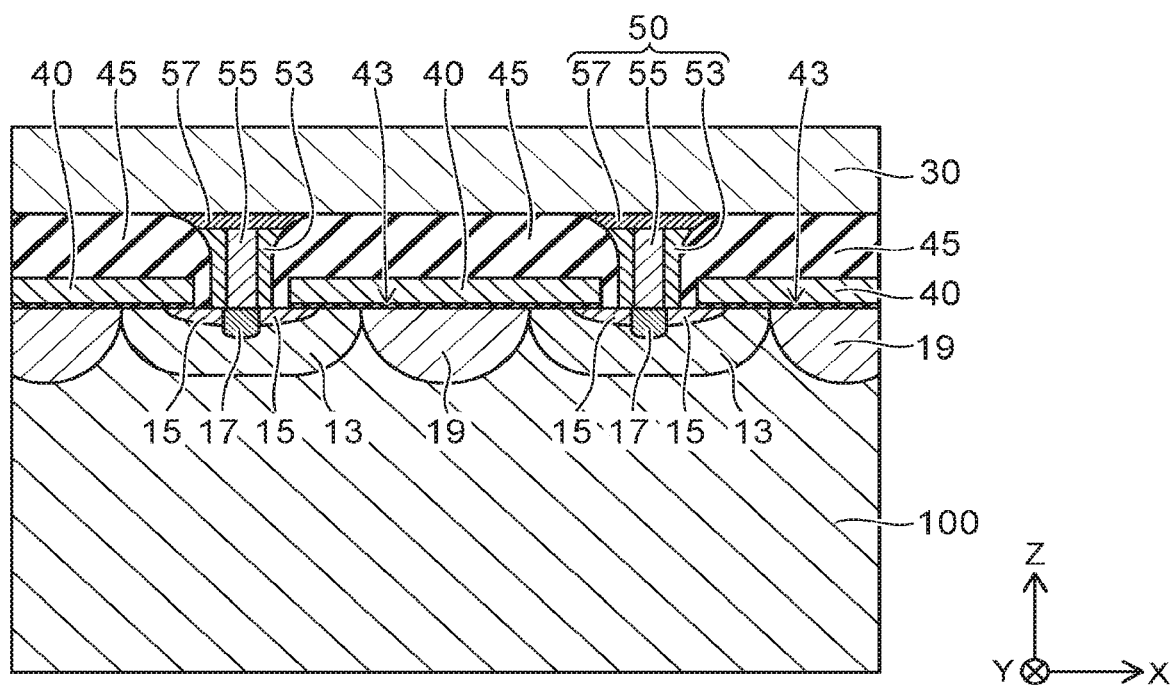

As shown in FIG. 5A, the source electrode 30 is formed at the front surface side of the semiconductor wafer 100. The source electrode 30 is formed to cover the inter-layer insulating film 45 and contacts the silicide region 57. The source electrode 30 includes, for example, aluminum and is electrically connected to the n-type semiconductor portion 53 and the p-type semiconductor portion 55 via the silicide region 57. The silicide region 57 reduces the contact resistance between the source electrode 30 and the n-type semiconductor portion 53 and between the source electrode 30 and the p-type semiconductor portion 55.

Figure 5B:
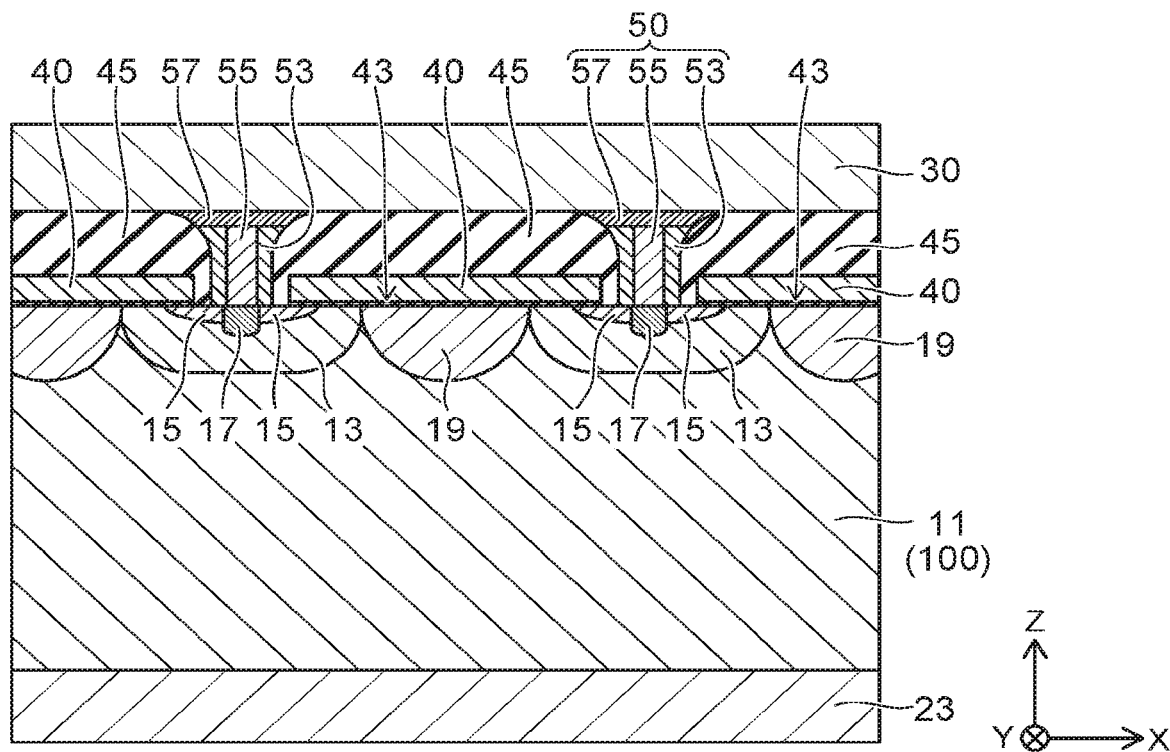

As shown in FIG. 5B, the n-type drain layer 23 is formed at the backside of the semiconductor wafer 100. For example, after thinning to a prescribed thickness by polishing the backside of the semiconductor wafer 100, the n-type drain layer 23 is formed by ion-implanting an n-type impurity, e.g., phosphorus (P). For example, heat treatment of the ion implantation n-type impurity is performed in a short period of time using laser annealing. The effects of the heat treatment on the MOS structure provided at the front surface side of the semiconductor wafer 100 can be reduced thereby.

The portion of the semiconductor wafer 100 positioned between the p-type base layer 13 and the n-type drain layer 23 is used to form the n-type drift layer 11. The semiconductor device 1 is completed by forming the drain electrode 20 on the back surface of the n-type drain layer 23.

In the manufacturing method according to the embodiment, carrier traps are formed by diffusing, inside the semiconductor part, platinum (Pt) from the silicide region 57 formed on the n-type semiconductor portion 53 and the p-type semiconductor portion 55. Thereby, it is possible to form carrier traps having a deep distribution inside the n-type drift layer 11 from the p-type base layer 13; and the switching characteristics of the semiconductor device 1 can be improved.

For example, there is also a method in which platinum (Pt) is diffused from the backside after forming the MOS structure including the source electrode 30 at the front surface side of the semiconductor wafer 100. However, the temperature and the time of the heat treatment after the formation of the MOS structure are limited so that the MOS structure does not degrade. Therefore, it is difficult to diffuse the platinum (Pt) deeply inside the n-type drift layer 11; and the improvement of the switching characteristics may be insufficient.

Conversely, in the manufacturing method according to the embodiment, the platinum (Pt) is diffused before the formation of the source electrode 30; therefore, heat treatment can be performed at a higher temperature for a long period of time. Thereby, it is possible to diffuse the platinum (Pt) to a deep position in the n-type drift layer 11; for example, the carrier traps can be distributed throughout the entire n-type drift layer 11. Also, the concentration of platinum distributed in the n-type drain layer 23 is equal to or lower than the concentration of platinum distributed inside the n-type drift layer 11.

There is also a method in which the contact hole CH is formed in the inter-layer insulating film 45 as shown in FIG. 2A; subsequently, the metal film 113 (referring to FIG. 4A) is formed to contact the semiconductor part 10 (the n-type source layer 15 and the p-type contact layer 17); and a silicide region that includes platinum (Pt) is formed directly on the semiconductor part 10. Thereby, the platinum (Pt) can be diffused into the semiconductor part 10. However, the adhesion strength between the inter-layer insulating film 45 (e.g., a silicon oxide film) and the metal film 113 including platinum (Pt) is low; therefore, the metal film 113 peels easily from the semiconductor part 10 at the bottom surface of the contact hole CH. Therefore, there are cases where the metal film 113 peels from the semiconductor part 10 in the heat treatment process for the siliciding, and a region where a silicide region is not formed occurs at the bottom surface of the contact hole CH. For example, when the aspect ratio (depth/width) of the contact hole CH becomes large, the silicide region can no longer be formed. As a result, the diffusion of platinum (Pt) is not stable between wafers; and the platinum concentration of the semiconductor part 10 fluctuates.

Conversely, in the manufacturing method according to the embodiment, the metal film 113 is formed on the planarized front surface of the n-type semiconductor portion 53, the p-type semiconductor portion 55, and the inter-layer insulating film 45 (referring to FIG. 4A). Therefore, the heat treatment can be performed without the metal film 113 peeling from the n-type semiconductor portion 53 and the p-type semiconductor portion 55. Accordingly, the platinum (Pt) can be diffused stably into the semiconductor part 10 via the n-type semiconductor portion 53 and the p-type semiconductor portion 55.

Although an example is shown in the manufacturing method recited above in which platinum (Pt) is diffused into the semiconductor part 10, the embodiment is not limited thereto. Instead of platinum (Pt), for example, ruthenium (Rh), palladium (Pd), osmium (Os), iridium (Ir), gold (Au), etc., may be used. By using these elements, the switching characteristics of the semiconductor device 1 can be improved.

Figure 6A:
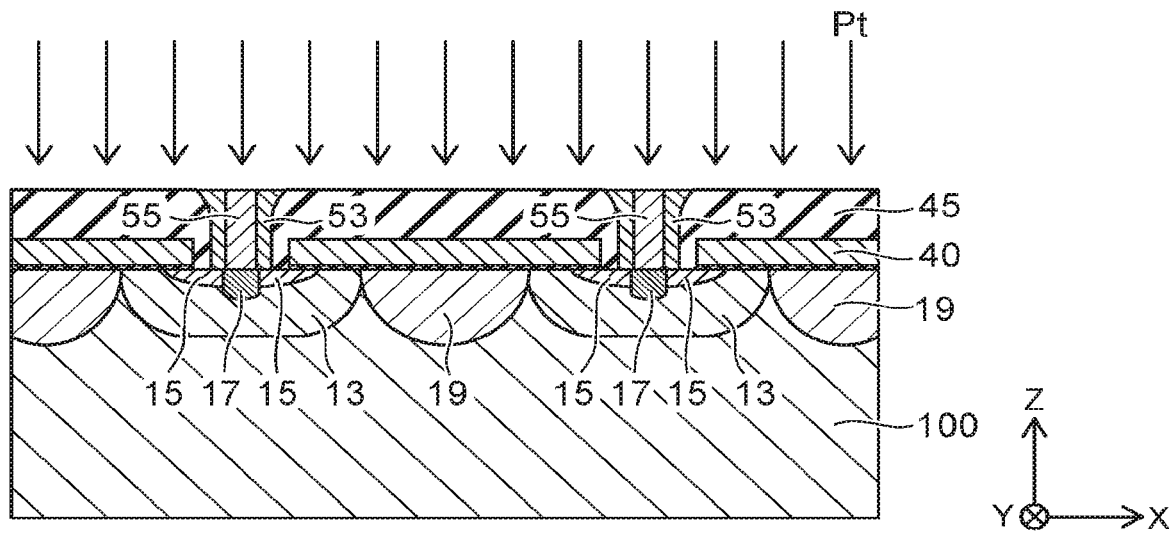
FIGS. 6A and 6B are schematic cross-sectional views showing a manufacturing process of the semiconductor device according to a first modification of the embodiment.
Figure 6B:
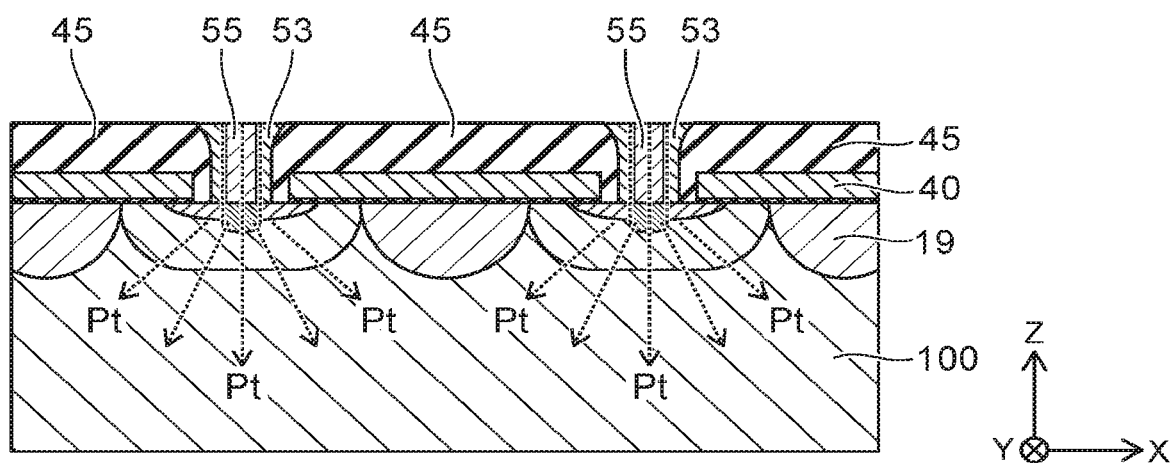

FIGS. 6A and 6B are schematic cross-sectional views showing a method of manufacturing the semiconductor device 1 according to a first modification of the embodiment. FIG. 6A shows the manufacturing process continuing from FIG. 3C.

As shown in FIG. 6A, platinum (Pt) is ion-implanted into the front surface side of the semiconductor wafer 100. Namely, instead of the metal film 113 shown in FIG. 4A, platinum (Pt) is introduced to the upper surface side of the n-type semiconductor portion 53 and the upper surface side of the p-type semiconductor portion 55 by using ion implantation.

Continuing as shown in FIG. 6B, the platinum (Pt) is diffused by heat treatment into the semiconductor part 10 via the n-type semiconductor portion 53 and the p-type semiconductor portion 55. The platinum (Pt) that is introduced to the inter-layer insulating film 45 stops inside the inter-layer insulating film 45 without being diffused by the heat treatment.

For example, the platinum (Pt) also can be diffused by direct ion implantation into the semiconductor part 10 after forming the contact hole CH in the inter-layer insulating film 45 as shown in FIG. 2A. However, the implantation damage formed by the ion implantation of the platinum (Pt) may cause the FET characteristics to degrade.

In the example, the damage due to the ion implantation is formed in the n-type semiconductor portion 53 and the p-type semiconductor portion 55. The n-type semiconductor portion 53 and the p-type semiconductor portion 55 are, for example, polysilicon regions; and the characteristics of the n-type semiconductor portion 53 and the p-type semiconductor portion 55 do not degrade due to implantation damage. In other words, it is sufficient for the n-type semiconductor portion 53 and the p-type semiconductor portion 55 to electrically connect between the source electrode 30 and the n-type source layer 15 and between the source electrode 30 and the p-type contact layer 17; and the characteristics of the n-type semiconductor portion 53 and the p-type semiconductor portion 55 do not degrade due to the implantation damage. Accordingly, the effects on the FET characteristics due to the implantation damage formed in the n-type semiconductor portion 53 and the p-type semiconductor portion 55 are small or can be avoided.

Figure 7A:
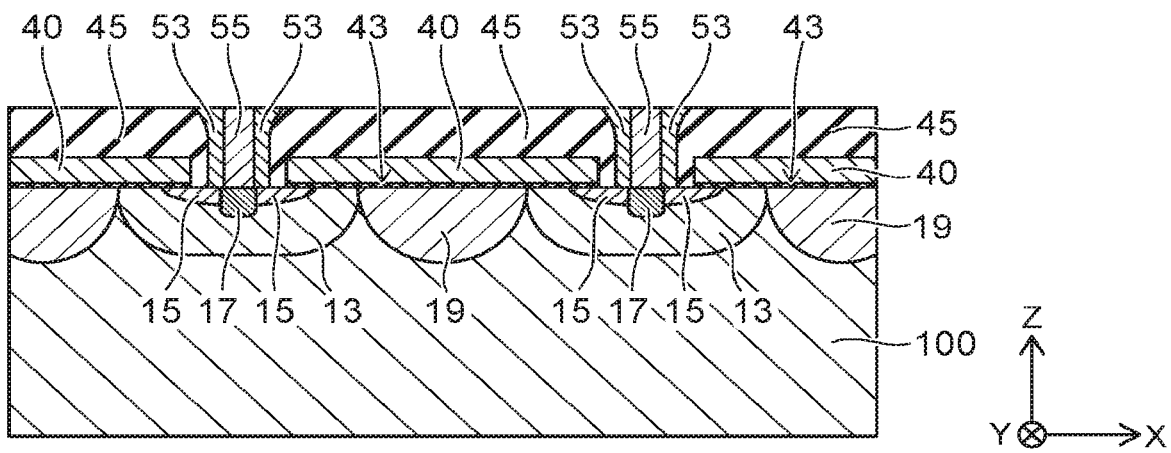
FIGS. 7A to 7C are schematic cross-sectional views showing a manufacturing process of a semiconductor device according to a second modification of the embodiment.
Figure 7B:
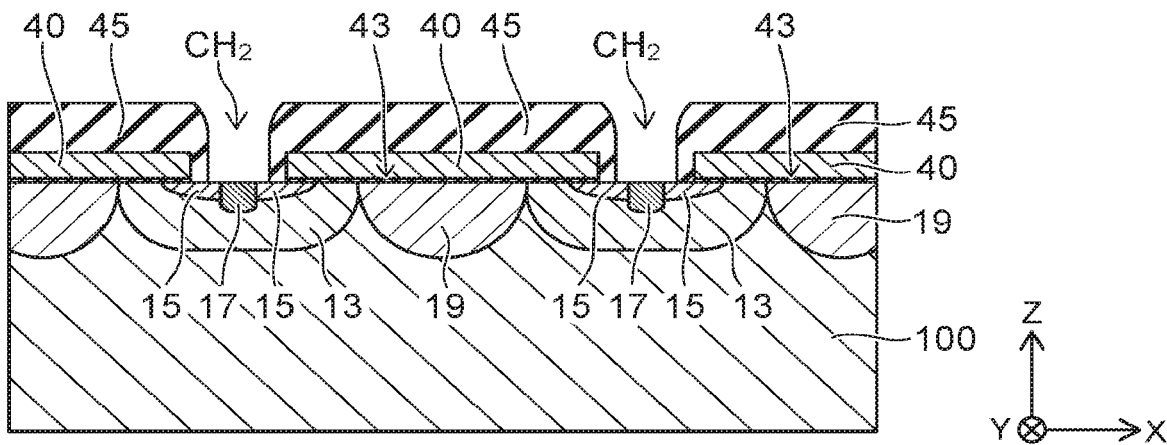
Figure 7C:
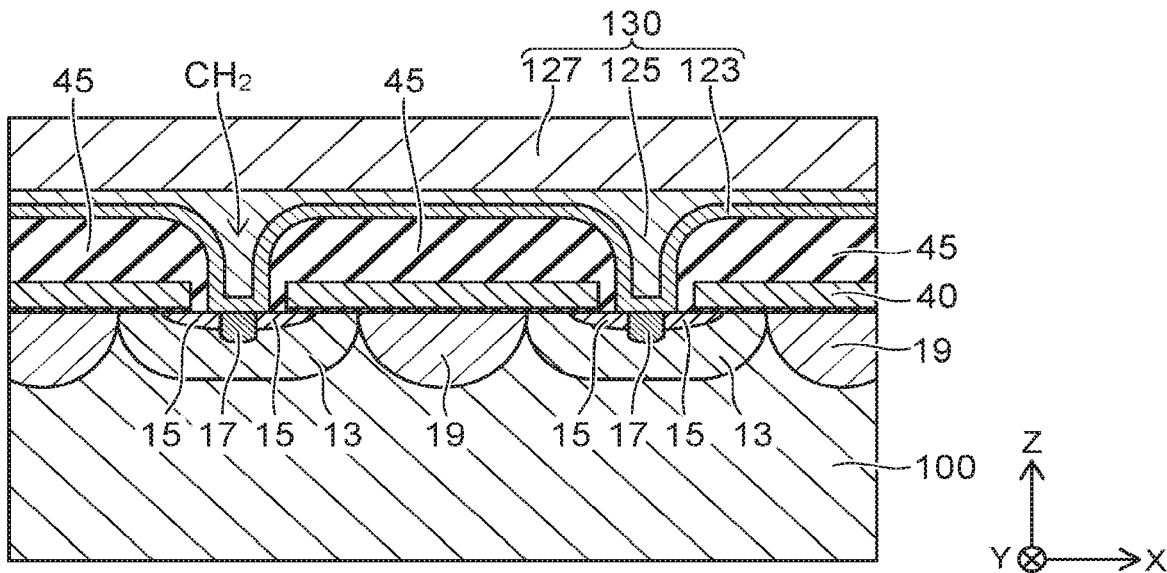

FIGS. 7A to 7C are schematic cross-sectional views showing a manufacturing process of a semiconductor device according to a second modification of the embodiment. FIG. 7A shows the manufacturing process continuing from FIG. 4C.

As shown in FIG. 7A, the platinum (Pt) is diffused into the semiconductor part 10; subsequently, the n-type semiconductor portion 53 and the p-type semiconductor portion 55 are exposed by removing the silicide region 57. For example, the silicide region 57 is removed by wet etching.

As shown in FIG. 7B, a contact hole $CH_2$ is formed by selectively removing the n-type semiconductor portion 53 and the p-type semiconductor portion 55. For example, the n-type source layer 15 and the p-type contact layer 17 are exposed at the bottom surface of the contact hole $CH_2$.

As shown in FIG. 7C, a source electrode 130 is formed at the front surface side of the semiconductor wafer 100. The source electrode 130 includes, for example, a barrier film 123, a buried film 125, and a bonding film 127. The source electrode 130 is provided to fill the contact hole $CH_2$ and is, for example, in contact with the n-type source layer 15 and the p-type contact layer 17 and electrically connected to the n-type source layer 15 and the p-type contact layer 17.

The barrier film 123 is formed to cover the upper surface of the inter-layer insulating film 45 and the inner surface of the contact hole $CH_2$. The barrier film 123 is formed to contact the n-type source layer 15 and the p-type contact layer 17. The barrier film 123 is, for example, a titanium nitride (TiN) film. The buried film 125 is, for example, a tungsten film and is formed to fill the interior of the contact hole $CH_2$. The bonding film 127 is, for example, an aluminum film and is formed on the buried film 125.

In the example, the electrical resistance of the portion filling the interior of the contact hole $CH_2$ can be reduced by replacing the n-type semiconductor portion 53 and the p-type semiconductor portion 55 with a metal film.

Figure 8A:
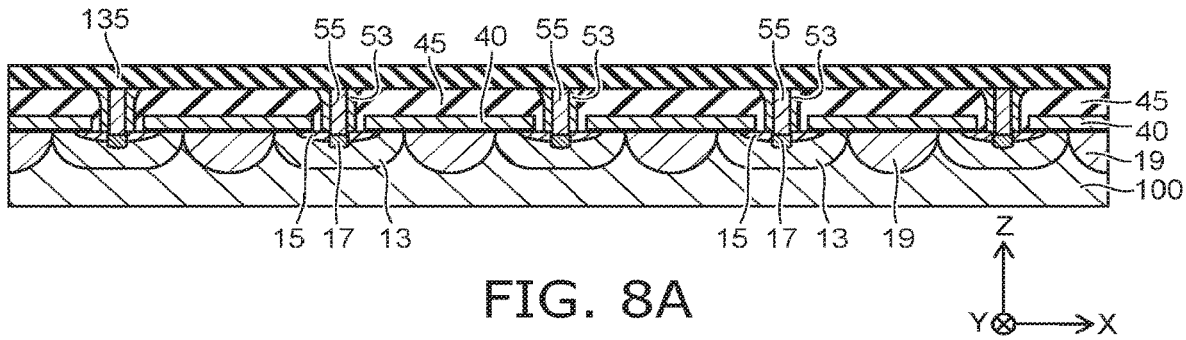
FIGS. 8A to 8D are schematic cross-sectional views showing a manufacturing process of the semiconductor device according to a third modification of the embodiment.

FIGS. 8A to 8D are schematic cross-sectional views showing a method of manufacturing the semiconductor device 1 according to a third modification of the embodiment. FIG. 8A is a schematic cross-sectional view showing the manufacturing process continuing from FIG. 3C.

As shown in FIG. 8A, an insulating film 135 is formed at the front surface side of the semiconductor wafer 100. The insulating film 135 is, for example, a silicon nitride film formed using CVD, or a silicon oxide film formed by oxidizing the surfaces of the n-type semiconductor portion 53 and the p-type semiconductor portion 55. When the insulating film 135 is formed using CVD, the insulating film 135 covers the inter-layer insulating film 45, the n-type semiconductor portion 53, and the p-type semiconductor portion 55. When the insulating film 135 is formed by oxidization, the insulating film 135 covers the n-type semiconductor portion 53 and the p-type semiconductor portion 55.

Figure 8B:
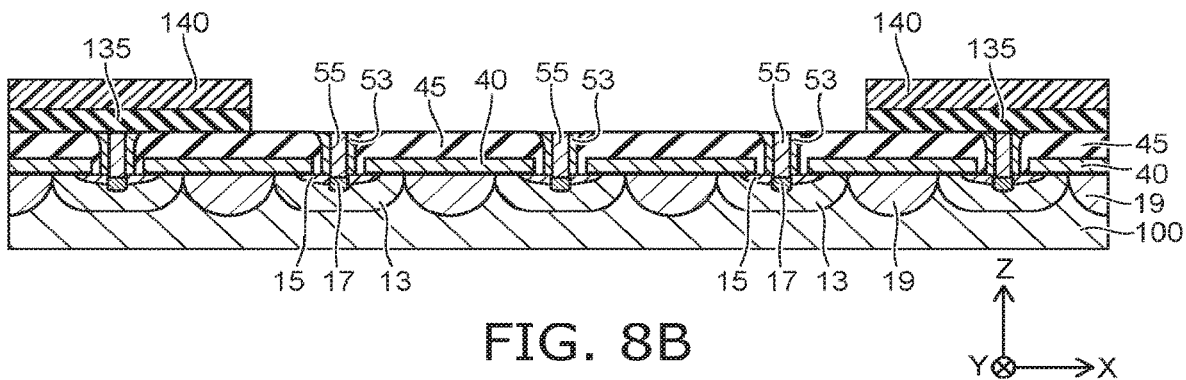

As shown in FIG. 8B, the n-type semiconductor portion 53 and the p-type semiconductor portion 55 are exposed by selectively removing the insulating film 135. For example, the insulating film 135 is selectively removed using a resist mask 140. The resist mask 140 is formed using photolithography. In the embodiment, the patterning in the photolithography is easy because the front surface of the inter-layer insulating film 45 is planarized where the n-type semiconductor portion 53 and the p-type semiconductor portion 55 are exposed.

Figure 8C:
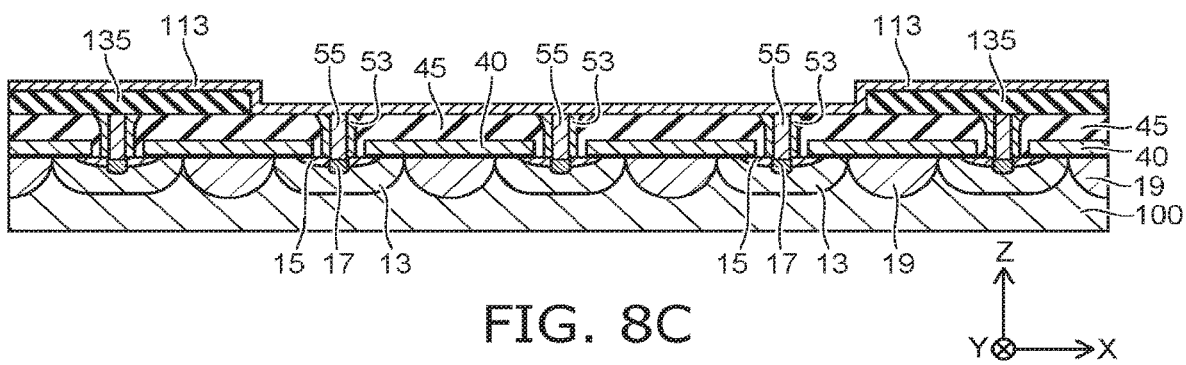

As shown in FIG. 8C, the metal film 113 is formed at the front surface side of the semiconductor wafer 100. For example, the metal film 113 is formed using sputtering and includes platinum (Pt). The metal film 113 is formed to cover the n-type semiconductor portion 53, the p-type semiconductor portion 55, and the insulating film 135. Continuing, by performing heat treatment, the silicide region 57 is formed at the boundary between the metal film 113 and the n-type semiconductor portion 53 and the boundary between the metal film 113 and the p-type semiconductor portion 55. The silicide region 57 includes platinum (Pt). The silicide region 57 is not formed on the n-type semiconductor portion 53 and the p-type semiconductor portion 55 that are covered with the insulating film 135.

Figure 8D:
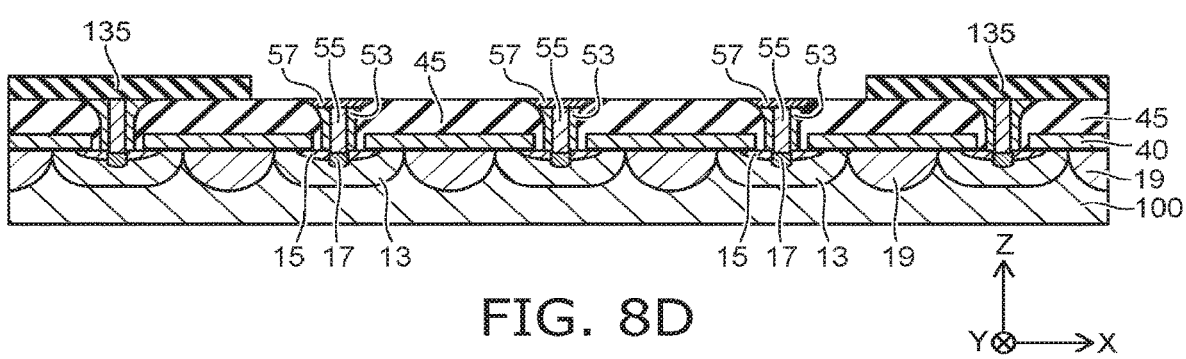

As shown in FIG. 8D, the metal film 113 is removed; and the silicide region 57 that has reacted with the n-type semiconductor portion 53 and the p-type semiconductor portion 55 remains. Continuing, the platinum (Pt) of the silicide region 57 is diffused toward the semiconductor part 10 via the n-type semiconductor portion 53 and the p-type semiconductor portion 55. In the example, the platinum (Pt) can be diffused selectively into the semiconductor part 10 in the region not covered with the insulating film 135. Continuing, the insulating film 135 is removed; and the source electrode 30 is formed.

Platinum (Pt) is not diffused into the n-type semiconductor portion 53 and the p-type semiconductor portion 55 where the silicide region 57 is not formed at the upper ends of the n-type semiconductor portion 53 and the p-type semiconductor portion 55. Even if platinum is diffused into the n-type semiconductor portion 53 and the p-type semiconductor portion 55 via the semiconductor wafer 100, the concentration of the platinum is lower than the concentration of the platinum (Pt) in the n-type semiconductor portion 53 and the p-type semiconductor portion 55 where the silicide region 57 is formed at the upper ends.

Figure 9A:
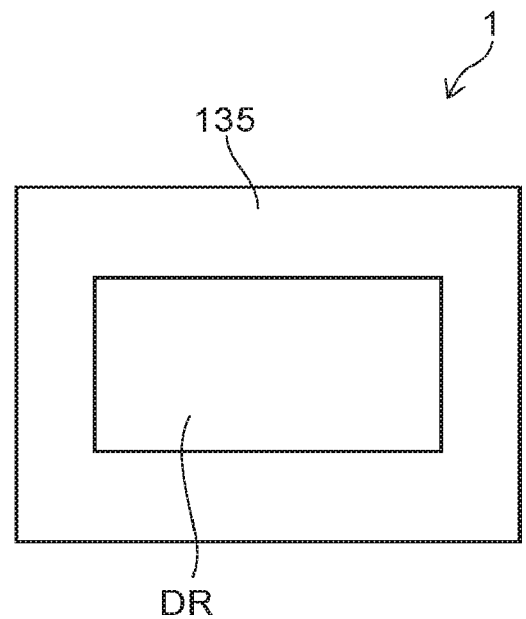
FIGS. 9A and 9B are schematic views showing a semiconductor device according to a third modification of the embodiment.
Figure 9B:
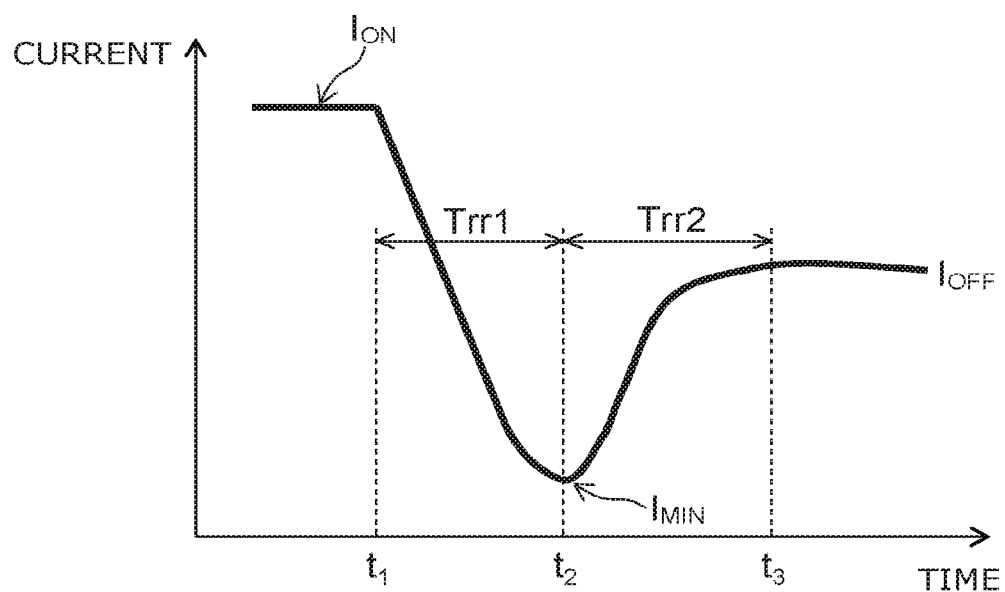

FIGS. 9A and 9B are schematic views showing a semiconductor device 1 according to a third modification of the embodiment. FIG. 9A is a plan view showing the front surface of the semiconductor wafer 100. FIG. 9B is a schematic view showing a switching characteristic of the semiconductor device 1.

As shown in FIG. 9A, the insulating film 135 is provided to surround a device region DR where platinum (Pt) is diffused. For example, the insulating film 135 is formed to cover a terminal region of the semiconductor device 1. In other words, the platinum (Pt) is selectively diffused into the device region DR of the semiconductor device 1 and forms carrier traps. Accordingly, carrier traps are not formed in the terminal region.

FIG. 9B shows a switching characteristic of the semiconductor device 1 made using the manufacturing process shown in FIGS. 8A to 8D. The vertical axis is the drain current flowing between the drain-source; and the horizontal axis is time.

For example, at a time $t_1$, the semiconductor device 1 is turned OFF; and the value of the drain current decreases. For example, the drain current decreases from a value $I_{ON}$ of the ON-state to a minimum value $I_{MIN}$ at a time $t_2$, and subsequently returns to a value $I_{OFF}$ of the OFF-state at a time $t_3$.

For example, a period Trr1 from the time $t_1$ to the time $t_2$ is dependent on the discharge time of the carriers from the n-type drift layer 11 toward the drain electrode 20 and the source electrode 30. Accordingly, in the semiconductor device 1, Trr1 can be shortened because the carrier traps are formed by diffusing platinum (Pt) into the n-type drift layer 11. The switching loss of the semiconductor device 1 can be reduced thereby.

For example, a period Trr2 from the time $t_2$ to the time $t_3$ is dependent on the discharge time of the carriers in the terminal region. For example, Trr2 is associated with switching noise; and the noise level can be suppressed better as Trr2 lengthens. In the semiconductor device 1, platinum (Pt) is not diffused into the terminal region; therefore, a long Trr2 is maintained; and the switching noise is suppressed.

Thus, in the semiconductor device 1, the switching characteristics can be improved by selectively diffusing platinum (Pt) into the device region and by suppressing the diffusion of platinum (Pt) into the terminal region.

Figure 10:
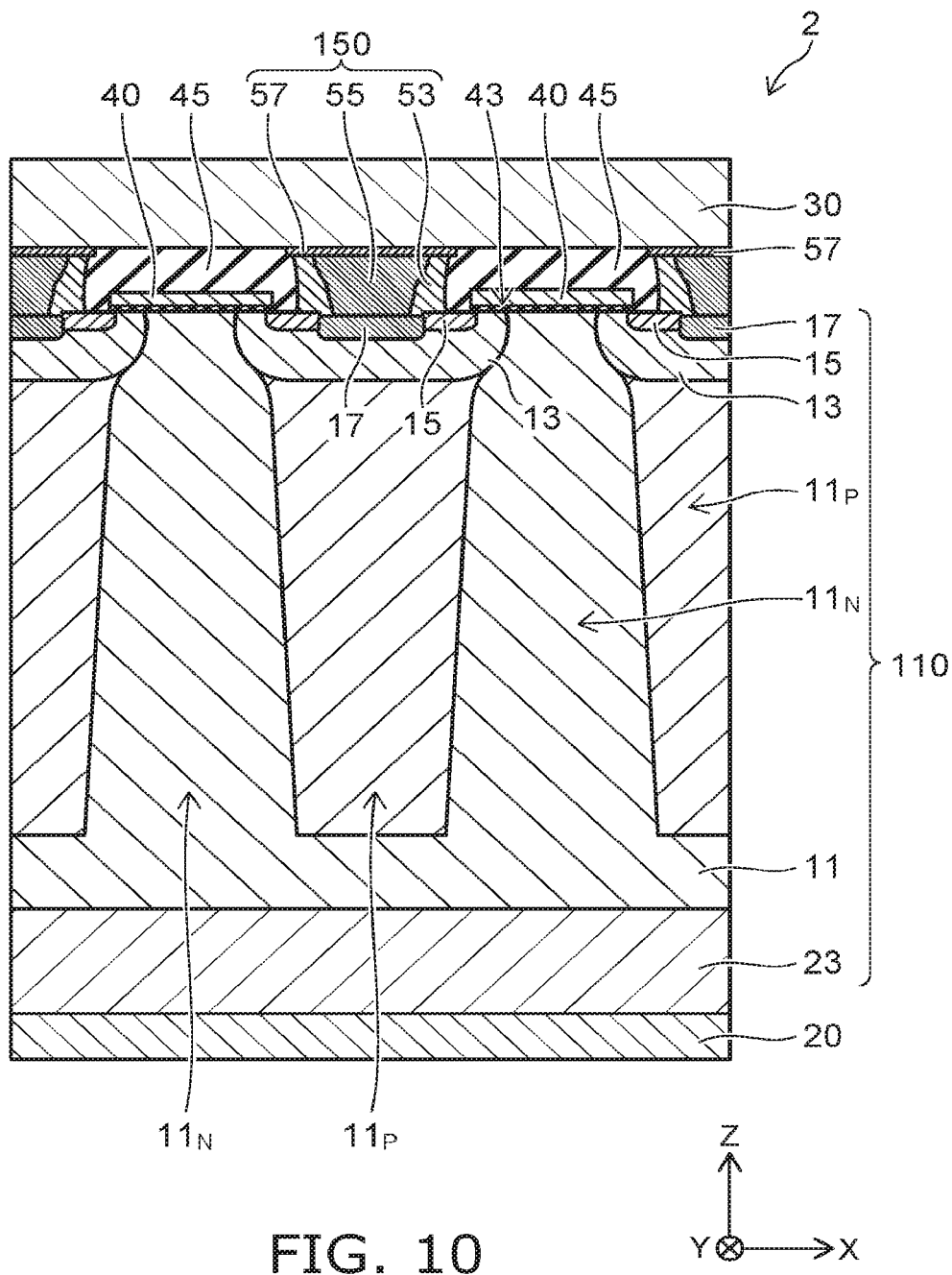
FIG. 10 is a schematic cross-sectional view showing a semiconductor device according to a fourth modification of the embodiment.

FIG. 10 is a schematic cross-sectional view showing a semiconductor device 2 according to a fourth modification of the embodiment. The semiconductor device 2 includes a semiconductor part 110, the drain electrode 20, the source electrode 30, and the gate electrode 40. The drain electrode 20 is provided at the backside of the semiconductor part 110; and the source electrode 30 is provided at the front surface side of the semiconductor part 110. The gate electrode 40 is provided between the semiconductor part 110 and the source electrode 30.

In the example, the semiconductor part 110 includes multiple p-type semiconductor portions $11_P$. The p-type semiconductor portions $11_P$ are provided inside the n-type drift layer 11. The p-type semiconductor portions $11_P$ are provided respectively between the n-type drain layer 23 and the p-type base layers 13. The p-type semiconductor portions $11_P$ are provided to be linked to the p-type base layer 13. The multiple p-type semiconductor portions $11_P$ are arranged in a direction (e.g., the X-direction) along the front surface or the back surface of the semiconductor part 110.

The n-type drift layer 11 includes an n-type semiconductor portion $11_N$. The n-type semiconductor portion $11_N$ is positioned between the p-type semiconductor portions $11_P$ next to each other in the X-direction. The p-type semiconductor portions $11_P$ and the n-type semiconductor portions $11_N$ are configured in a so-called super junction structure. For example, the p-type semiconductor portion $11_P$ and the n-type semiconductor portion $11_N$ that are adjacent to each other in the X-direction are formed to include substantially the same total amounts respectively of an n-type impurity and a p-type impurity.

As shown in FIG. 10, the semiconductor device 2 includes a contacting part 150 electrically connecting the source electrode 30 and the semiconductor part 110. The contacting part 150 includes the n-type semiconductor portion 53, the p-type semiconductor portion 55, and the silicide region 57.

The n-type semiconductor portion 53 contacts the n-type source layer 15 and is electrically connected to the n-type source layer 15. The p-type semiconductor portion 55 contacts the p-type contact layer 17 and is electrically connected to the p-type contact layer 17. The n-type semiconductor portion 53 and the p-type semiconductor portion 55 are electrically connected to the source electrode 30 via the silicide region 57.

For example, the semiconductor part 110 and the contacting part 150 are provided to include platinum (Pt). The platinum (Pt) is distributed from the contacting part 150 into the p-type base layer 13, the p-type semiconductor portion $11_P$, and the n-type semiconductor portion $11_N$.

In the example as well, the platinum (Pt) that is distributed in the semiconductor part 110 can be provided uniformly. The switching characteristics of the semiconductor device 2 can be improved thereby. The semiconductor device 2 can be manufactured using any of the manufacturing methods recited above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of manufacturing a semiconductor device, comprising:
   forming an insulating film on a semiconductor wafer, the insulating film having a contact hole;
   forming a semiconductor portion filling the contact hole, the semiconductor portion including at least one element of platinum (Pt), ruthenium (Rh), palladium (Pd), osmium (Os), iridium (Ir), or gold (Au); and
   diffusing the at least one element inside the semiconductor wafer from the semiconductor portion.

2. The method according to claim 1, further comprising:
   forming a metal film covering the insulating film and the semiconductor portion, the metal film including the at least one element; and
   diffusing the at least one element inside the semiconductor portion.

3. The method according to claim 2, further comprising:
   forming a silicide region including the at least one element on the semiconductor portion,
   wherein the at least one element is diffused into the semiconductor portion from the silicide region.

4. The method according to claim 1, wherein the semiconductor portion is removed after the diffusing of the at least one element inside the semiconductor wafer.

5. The method according to claim 1, further comprising:
   selectively forming another insulating film on the insulating film; and
   forming a metal film covering the insulating film, the metal film including the at least one element, wherein
   a plurality of the contact holes and a plurality of the semiconductor portions are provided in the insulating film, the plurality of semiconductor portions including a first semiconductor portion and a plurality of second semiconductor portions, the second semiconductor portions being provided around the first semiconductor portion;
   the another insulating film covers the second semiconductor portions and a portion of the insulating film around the second semiconductor portions;
   the metal film is in contact with the first semiconductor portion; and
   the at least one element is selectively diffused into the first semiconductor portion.

6. The method according to claim 5, wherein
   the metal film covers the insulating film and the another insulating film, and
   the metal film is in contact with the first semiconductor portion and the another insulating film on the second semiconductor portions.

7. The method according claim 1, wherein
   the at least one element is ion-implanted into the semiconductor portion, and is diffused into the semiconductor wafer by performing heat treatment of the semiconductor wafer.

* * * * *